(12) United States Patent
Jourdan et al.

(10) Patent No.: US 10,889,490 B2
(45) Date of Patent: *Jan. 12, 2021

(54) ELECTROTHERMALLY ACTUATED MICROELECTROMECHANICAL AND/OR NANOELECTROMECHANICAL STRUCTURE PROVIDING INCREASED EFFICIENCY

(71) Applicants: COMMISSARIAT A L'ENERGIE ATOMIQUE ET AUX ENERGIES ALTERNATIVES, Paris (FR); SAFRAN ELECTRONICS & DEFENSE, Boulogne Billancourt (FR)

(72) Inventors: Guillaume Jourdan, Grenoble (FR); Guillaume Lehee, Boulogne Billancourt (FR)

(73) Assignees: COMMISSARIAT A L'ENERGIE ATOMIQUE ET AUX ENERGIES ALTERNATIVES, Paris (FR); SAFRAN ELECTRONICS & DEFENSE, Boulogne Billancourt (FR)

( * ) Notice: Subject to any disclaimer, the term of this patent is extended or adjusted under 35 U.S.C. 154(b) by 0 days.

This patent is subject to a terminal disclaimer.

(21) Appl. No.: 15/768,870

(22) PCT Filed: Oct. 20, 2016

(86) PCT No.: PCT/EP2016/075188
§ 371 (c)(1),
(2) Date: Apr. 17, 2018

(87) PCT Pub. No.: WO2017/068025
PCT Pub. Date: Apr. 27, 2017

(65) Prior Publication Data
US 2018/0327253 A1 Nov. 15, 2018

(30) Foreign Application Priority Data
Oct. 21, 2015 (FR) .................... 15 60043

(51) Int. Cl.
B81B 3/00 (2006.01)
B81B 7/02 (2006.01)
(Continued)

(52) U.S. Cl.
CPC ............. *B81B 3/0024* (2013.01); *B81B 7/02* (2013.01); *G02B 6/3584* (2013.01);
(Continued)

(58) Field of Classification Search
CPC ............... H02N 10/00; B81B 3/0024; B81B 2201/031; H01L 29/0669; H01L 21/76898;
(Continued)

(56) References Cited

U.S. PATENT DOCUMENTS 6,675,578 B1 * 1/2004 Sinclair ................ B81B 3/0051
310/307
7,692,521 B1 * 4/2010 Cohn ................ H01H 59/0009
335/78
(Continued)

FOREIGN PATENT DOCUMENTS

EP 2 322 971 A2 5/2011
EP 2 711 696 A1 3/2014

OTHER PUBLICATIONS

International Search Report dated Nov. 14, 2016 in PCT/EP2016/075188 filed Oct. 20, 2016.
(Continued)

*Primary Examiner* — Joseph M Galvin, III
(74) *Attorney, Agent, or Firm* — Oblon, McClelland, Maier & Neustadt, L.L.P.

(57) ABSTRACT

An electrothermally actuated microelectromechanical and/or nanoelectromechanical structure including a stationary portion, at least one portion which is movable relative to the stationary portion, at least one electrothermal actuation beam which makes it possible to cause an electric current to
(Continued)

flow from the stationary portion to the movable portion, is mechanically connected to the movable portion and is intended to move the movable portion relative to the stationary portion by electrothermal actuation, and at least one electrically conductive connection element electrically connecting the movable portion to the stationary portion, the actuation beam having a thickness of no greater than half one thickness of the movable portion and no greater than half one thickness of the connection element.

19 Claims, 9 Drawing Sheets

(51) Int. Cl.
*G02B 6/35* (2006.01)
*G02B 26/08* (2006.01)

(52) U.S. Cl.
CPC ........ *G02B 26/0841* (2013.01); *B81B 3/0086* (2013.01); *B81B 2201/0264* (2013.01); *B81B 2201/0271* (2013.01)

(58) Field of Classification Search
CPC ....... H01L 21/56; H01L 21/568; H01L 21/84; H01L 21/50; H01L 23/481; H01L 23/10; H01L 23/051; H01L 23/544; H01L 23/04; H01L 23/522; H01L 23/528; H01L 23/66; H01L 23/3107; H01L 23/498; H01L 27/1203; H01L 27/0688; H01L 27/22; H01L 27/16; H01L 27/0617; H01L 29/84
See application file for complete search history.

(56) References Cited

U.S. PATENT DOCUMENTS

| | | | |
|---|---|---|---|
| 2014/0076024 A1* | 3/2014 | Duraffourg | G01N 25/18 73/23.4 |
| 2015/0047078 A1* | 2/2015 | Sarkar | G01Q 20/04 850/1 |
| 2017/0117825 A1* | 4/2017 | Jourdan | B81B 3/0024 |

OTHER PUBLICATIONS

Preliminary French Search Report dated Jul. 4, 2016 in French Application 1560043 filed Oct. 21, 2015.
Rahafrooz, A. et al., "Thermal-Piezoresistive Energy Pumps in Micromechanical Resonant Structures", IEEE Transactions on Electron Devices, Dec. 2012, vol. 59, No. 12, pp. 3587-3593.
Guo, X. et al., "Gas Sensing using thermally actuated dual plate resonators and self-sustained oscillators", Frequency Control Symposium (FCS), IEEE International, 2012, 5 total pages.
Li, K.-H. et al., "A Self-sustained Nanomechanical Thermal-piezoresistive Oscillator with Ultra-Low Power Consumption", Electron Devices Meeting (IEDM), IEEE International, 2014, pp. 22.2.1-22.2.4.

* cited by examiner

ELECTROTHERMALLY ACTUATED MICROELECTROMECHANICAL AND/OR NANOELECTROMECHANICAL STRUCTURE PROVIDING INCREASED EFFICIENCY

TECHNICAL FIELD AND STATE OF PRIOR ART

The present invention relates to an electrothermally actuated microelectromechanical and/or nanoelectromechanical structure offering an improved efficiency, for example to make an actuator or a sensor.

Microelectromechanical (MEMS) and/or nanoelectromechanical (NEMS) systems comprise a fixed part and at least one movable part and actuation means for moving the movable part with respect to the fixed part.

The actuation device can be of different types.

The actuation device can be of the electrostatic type, comprising actuation electrodes, for example as capacitive combs or facing electrodes, which occupy a significant space and which can be of sizes comparable to that of the MEMS or NEMS. Further, the intensity of the capacitive force strongly decreases when the dimensions of the MEMS or NEMS are reduced. In addition, the electrostatic actuation requires inter-electrode spaces lower than a few µms in order to be capable of generating sufficiently high forces. These inter-electrode spaces are often one of the main mechanical energy dissipation sources in the MEMS and NEMS which is due to the damping phenomenon called squeeze film damping, even under vacuum (up to 0.001-0.1 mbar).

The actuation device can be of the piezoelectric type, using a stack of piezoelectric materials. On the one hand, the device is relatively bulky relative to the MEMS or NEMS structure to be actuated. On the other hand, the method for making the stack of piezoelectric materials can be complex.

The actuation device can be of the magnetic type comprising a permanent magnet. It can also have bulk problems. Moreover, the efficiency of this device strongly decreases with an increasing size of the MEMS or NEMS.

There is also an electrothermal type actuation device. The electrothermal actuation uses thermoelastic properties of the solids to move MEMS structures. Indeed, when an electric conductor is electrically biased, this dissipates energy by Joule effect, which generates a heating of the conductor which expands because of the thermoelastic properties of the material which makes up the structure of the MEMS or NEMS.

Document Rahafrooz A, Pourkamali S. *Thermal-Piezoresistive Energy Pumps in Micromechanical Resonant Structures. IEEE Trans Electron Devices.* 2012 December; 59(12):3587-93 describes a resonant structure comprising two suspended elements connected by two parallel actuation beams, both actuation beams being each suspended to the substrate by means of an embedded side beam. Biasing both actuation beams via both embedded beams enables the actuation beams to be heated and an electrothermal actuation to be generated, the beams expand, both suspended elements are then moved with respect to each other. By applying a sinusoidal bias, the suspended elements are vibrated. A high frequency resonator can be made. Document Xiabobo Guo, Yun-bo Yi, Rahafrooz A, Pourkamali, *Gas Sensing using thermally actuated dual plate resonators and self-sustained oscillators.* Frequency Control Symposium (FCS), 2012 IEEE International. 2012. p. 1-5 describes a surrounding gas-sensitive system comprising two suspended elements connected by two parallel actuating beams. Each suspended element is connected to the substrate by two bending-loaded beams.

The energy efficiency r between the actuation beam and the electric generator can be written as $$r = \frac{Pbeam}{P\text{ total}} = \frac{Rbeam}{R\text{ beam} + R\text{ access}}$$

Pbeam is the Joule power dissipated at the actuation beam(s), Ptotal is the total Joule power dissipated at the entire structure, Rbeam is the electrical resistance of the actuation beam(s), and Raccess is the electric resistance of part of the MEMS structure between the current source and the actuation beam(s), this resistance comprises in particular the resistances of the access resistances present in the MEMS structure and outside the MEMS structure, such as those of the tracks, those of the contact pads, etc.

A Joule-effect energy dissipation in these access resistances reduces the transfer efficiency of the power delivered by a generator to the actuation beam. If this energy dissipation is too high relative to that in the actuation beam(s), the efficiency is substantially reduced.

The resistances of the actuation beams are in the order of a few ohms because of the dimensions of the structures and the doping, which is for example in the order of $10 \times 10^{19}$ cm$^{-3}$. A typical actuation current in the order of 10 mA is required to produce heatings and then usual actuation forces. At the actuation beam, the output power for actuation is thus in the order of a few hundreds of µWs.

On the other hand, the supply sources of the control electronics (ASIC, FPGA, etc.) have voltages in the order of a few V: the power necessary to produce desired currents in the absence of current conversion stage—which are often omitted because they generate noise or because they are too bulky in a miniaturization context—actually reaches a few tens of mWs, which corresponds to high power levels for portable systems, such as autonomous units, smartphone, etc. As a result, a low power transfer efficiency to the beam of $\frac{1}{1000}$ can finally be obtained. Current levels in the range 1-100 mA are not compatible with usual "low consumption" requirements of consumer sensors.

In the structure described in document Rahafrooz A, Pourkamali S. *Thermal-Piezoresistive Energy Pumps in Micromechanical Resonant Structures. IEEE Trans Electron Devices.* 2012 December; 59(12):3587-93, the actuation current exits back from the structure through an actuation beam, which enables a good energy efficiency to be preserved.

However, obtaining this good yield limits choices in the achievable electrothermal actuation structures. In particular, the disposition of the movable elements and actuation beams imposes that the actuation beams work in phase, otherwise the actuation strains would opposite to each other.

Beyond the energy efficiency, it is attempted to improve the transduction energy efficiency, i.e. it is attempted to produce a force with very few electric power.

DISCLOSURE OF THE INVENTION

Consequently, a purpose of the present invention is to offer an electrothermally actuated MEMS and/or NEMS structure offering a good transduction energy efficiency while offering a high degree of freedom in choosing the configuration of the MEMS and/or NEMS structure.

The transduction energy efficiency is the ratio of the force produced to the total energy consumed.

The abovementioned purpose is achieved by an electrothermally actuated MEMS and/or NEMS structure comprising a fixed part, at least one movable part being movable relatively to the fixed part, a plurality of actuation beams connected to the movable part and at least one electrical connecting element between the movable part and the fixed part, the thickness of the actuation beam being lower than or equal to half the thickness of the movable part and the connecting element, the actuation beams being nanowires.

As a result of the thickness difference between the actuation beams and the thickness of the movable part and the thickness of the connecting element, the electric resistance in the beam is very high with respect to that of the movable part and to the resistance of the connecting element, and the current density is significant in the actuation beam and is very low in the other conduction elements of the MEMS. The Joule-effect losses are thus concentrated in the actuation beam and the temperature rise is favoured in the actuation beam. The electrical-thermal conversion efficiency at the actuation beam and thus the mechanical efficiency are thereby improved.

On the other hand, this choice in the thickness of the actuation beam enables a good energy efficiency to be achieved without being restricted to particular structures.

On the other hand, the use of a plurality of nanowires instead of a beam having an equivalent total cross-section in a same material, enables a higher heating in the nanowires to be obtained with a same total bias current. The current density in the beams remains identical, as well as the Joule-effect dissipated power. This results in a greater actuation force for a same consumed power. Indeed, the nanowires of a given material have thermal conductivities lower than those of the material in volume because the phonon-phonon or phonon-surface type interaction process is intensified.

On the other hand, the use of a plurality of nanowires in comparison with a single nanowire enables the temperature rise to be limited while offering an improved transduction efficiency. Indeed, for a same actuation force, the consumed power can of course be identical, but it is accompanied by a temperature rise in the nanowire which could be incompatible with a proper system operation.

Further, the implementation of several beams enables mechanical properties to be provided to the MEMS. Indeed, a significant cross-section can be necessary to ensure some stiffness level or a resistance to external mechanical loads (impact, etc.). This significant cross-section can be obtained by summing the cross-sections of the nanowires.

By virtue of the invention, an electrothermally actuated microelectromechanical and/or nanoelectromechanical structure is obtained having an increased transduction energy efficiency.

The current delivered for the actuation decreases, consequently there is a lesser power delivered by the generator, which makes the MEMS and/or NEMS structure compatible with portable and/or consumer systems.

In other words, the actuation electric current flows along a conduction path through the MEMS and/or NEMS structure passing through the fixed part, the actuation beams as nanowires, the movable part, the connecting element and again the fixed part. In this conduction path, a strong electric resistance zone is thereby defined, relatively to that of the movable part and to that of the connecting element. This strong resistance zone thereby undergoes a substantially higher self-heating than the movable part and the connecting element, this zone is formed by the actuation beams. Further, by implementing several nanowires, the heating which is distributed between the different nanowires is limited and the transduction efficiency is improved because each nanowire individually offers improved transduction efficiencies. An improved transduction energy efficiency results therefrom.

Very advantageously, the actuation beam(s) have at least one transverse dimension lower than or equal to 500 nm.

A low self-heating of the connecting element results also therefrom, the force generated by self-heating is thereby reduced with respect to that generated in the actuation beam, this actuation force does not oppose and/or does not deteriorate thereby the actuation action of the actuation beam.

The connecting element can also have a configuration and/or disposition with respect to the actuation beam, such that the force generated by electrothermal effect in the connecting element does not oppose and/or does not deteriorate the action of the actuation beam.

In a particularly advantageous embodiment, the MEMS and/or NEMS structure comprises a movable part and at least two actuation beams, at least one connecting element between the movable part and the fixed part and means for generating a current different in each actuation beam thus enabling different strains to be generated. This embodiment enables for example a structure to be made in which two actuation beams located on either side of the movable part are aligned and in which the actuation forces generated in the actuation beams are constructive.

Thereby, a subject-matter of the present invention is to provide an electrothermally actuated microelectromechanical and/or nanoelectromechanical structure comprising a fixed part, at least one part movable with respect to the fixed part, at least one electrothermal actuation beam for flowing an electric current from the fixed part to the movable part and mechanically connected to the movable part and for moving the movable part with respect to the fixed part by electrothermal actuation, and at least one electrically conductive connecting element electrically connecting the movable part to the fixed part, the actuation beam having a thickness lower than or equal to half a thickness of the movable part and lower than or equal to half a thickness of the connecting element.

Very advantageously, the structure can comprise at least one set of several electrothermal actuation beams capable of simultaneously applying an electrothermal force having the same direction to the movable part. In an advantageous example, the actuation beams are nanowires, which have a decreased thermal conductivity, which improves their self-heating.

Preferably, the electrothermal actuation beam comprises one or more thermoelastic materials able to be deformed under the effect of Joule-effect induced thermal heating by the electric current for flowing in said beam.

The actuation beam can be mechanically connected to the fixed part and to the movable part, or to two movable parts.

The electrothermal actuation beam has advantageously an aspect ratio between 1 and 2.

The connecting element has preferably a shape such that an electrothermal force generated therewithin opposes little or not the electrothermal force generated in the actuation beam. Advantageously, the connecting element is in the shape of a spring folded as slots or meander pattern. Alternatively, the connecting element can have any shape offering it an in-plane mechanical flexibility, and could be formed by a spring with two spirals, chevrons . . . etc.

In an exemplary embodiment, the connecting element extends along an axis perpendicular to an axis to which the actuation beam is parallel. Advantageously, the structure comprises two connecting elements aligned along an axis perpendicular to an axis to which the actuation beam is parallel.

In a very advantageous example, the actuation beam is a nanowire, because the very small dimensions of the nanowire enable the thermal resistivity of the material making up said nanowire to be improved, which enables thermal heating of the nanowire material to be increased for a given electric power. The thickness and/or width of the nanowire are lower than or equal to 500 nm.

In an exemplary embodiment, the structure can comprise a rotational hinge between the fixed part and the movable part and in which the actuation beam is disposed with respect to the movable part so as to cause its rotation with respect to the fixed part, said rotation being in-plane or out-of-plane of the structure.

The rotational hinge can comprise the aligned connecting element(s) defining the axis of rotation, said connecting element(s) being torsionally deformable and wherein the actuation beam is mechanically connected to the movable part such that the electrothermal force generated in the actuation beam causes the out-of-plane rotation of the movable part.

In another exemplary embodiment, the rotational hinge can comprise two connecting elements the axes of which are secant.

In another exemplary embodiment, the movable part is mechanically connected to the fixed part by an anchor, said anchor forming a connecting element and the actuation beam being oriented with respect to the movable part to cause its elastic deformation.

Preferably, the thickness of the movable part and the thickness of the connecting element are equal.

The structure can further comprise means for detecting a movement of the movable part. The detecting means are advantageously piezoresistive means. Alternatively, the detecting means could be piezoelectric means or any other suitable means. Advantageously, the detecting means are formed by the actuation beam.

Another subject-matter of the present invention is to provide an actuator comprising at least one structure according to the invention.

Another subject-matter of the present invention is a sensor comprising at least one structure according to the invention.

BRIEF DESCRIPTION OF THE DRAWINGS

The present invention will be better understood based on the description that follows and the appended drawings in which.

DETAILED DISCLOSURE OF PARTICULAR EMBODIMENTS

The description that follows will describe electrothermally actuated MEMS and/or NEMS structures, these structures being possibly implemented in a great number of applications, such as actuators for moving a mirror or a switch and sensors.

In the present application, by "movable part", it is meant a part of a MEMS and/or NEMS structure able to be moved at least partially with respect to a fixed part or a substrate of the MEMS and/or NEMS structure in the plane of the structure or off the plane of the structure. By "at least partial" movement, it is meant a part which would be for example anchored by one end to the fixed part and another end of which would be mechanically elastically deformed.

Figure 1A:
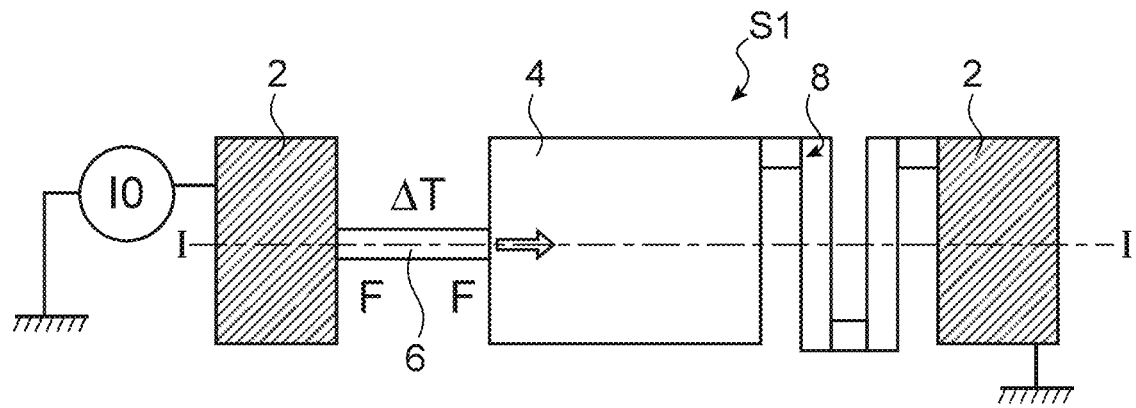
FIG. 1A is a top view of an exemplary embodiment of a MEMS and/or NEMS structure according to the invention with an in-plane motion.
Figure 1B:
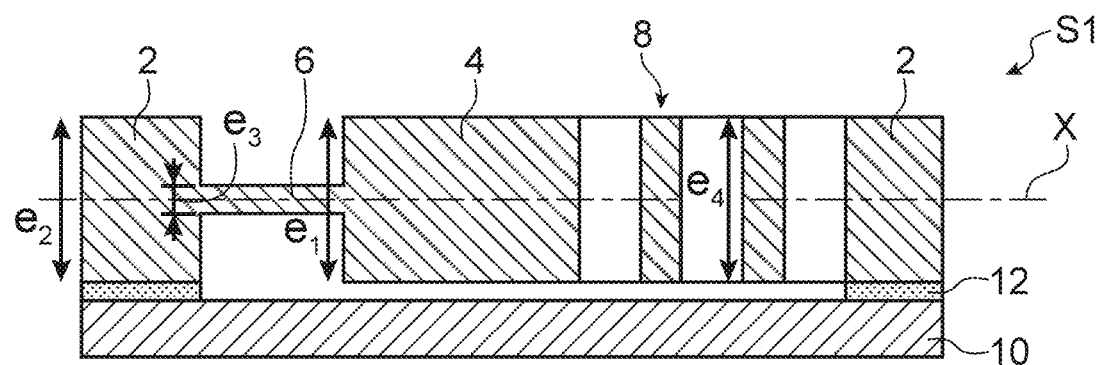
FIG. 1B is a longitudinal cross-section view along plane I-I of the structure of FIG. 1A.

In FIGS. 1A and 1B, an exemplary embodiment of an in-plane electrothermally actuated MEMS and/or NEMS structure S1 comprises a fixed part 2, a suspended part 4 with respect to the fixed part and for being moved with respect to the fixed part 2, an actuation beam 6 connecting the fixed part and the movable part 4 and a connecting element 8 also between the fixed part 2 and the movable part 4.

In the example represented, the actuation beam extends along an axis X which is the direction of movement of the movable part 4 with respect to the fixed part. The fixed part has one degree of freedom in movement along the axis X.

The electrothermal actuation beam 6 advantageously comprises one or more thermoelastic materials able to be deformed under the effect of a Joule-effect induced heating by the electric current for flowing in said beam. The material(s) is (are) chosen from silicon, SiC, SiN for example. If the material is not electrically conductive, the electrical conduction and Joule-effect can be ensured by a conductive material deposited onto the beam (Si, Al, etc.)

The connecting element 8 is connected to the movable part on a face opposite to that to which the actuation beam 6 is connected. The connecting element 8 has advantageously a shape of a spring with slots so as to have some flexibility in the direction of axis X. Further, this shape advantageously enables the electrothermal force appearing in the connecting element and which will be described below to be reduced. The connecting element can have another shape, such as a spring with two spirals or a chevron.

The fixed part 2, the movable part 4, the actuation beam 6 and the connecting element 8 are made of one or more electrically conductive materials.

The connecting element has advantageously also the function of suspending element. It further offers a significant out-of-plane stiffness of the structure especially since, as will be described in the following, the suspending element has a significant thickness with respect to that of the actuation beam which offers a lesser out-of-plane stiffness.

The fixed part 2 is integral with a substrate 10 which extends on the entire MEMS and/or NEMS structure and is electrically insulated from the same by one electrically insulating layer 12. The thickness of the fixed part 2 which is electrically conductive is equal to e2. The movable part has a thickness e1. In this example and preferably, because of the manufacturing method, the fixed part 2 and the movable part 4 come from the same layer of electrically conductive material, for example of a semi-conductor material. As a result, e1=e2.

The thickness of the actuation beam is designated e3 and the thickness of the connecting element is designated e4.

The thickness e3 of the actuation beam 6 is lower than or equal to half the thickness of the movable part and lower than or equal to half the thickness of the connecting element, i.e. e3≤e2/2 and e3≤e4/2.

Preferably, the width of the actuation beam is chosen so as to have an aspect ratio between 1 and 2.

The beam has for example a cross-section of 250 nm×250 nm and the length of the actuation beam is for example between 100 nm and 100 μm. e3 is for example between 10 nm and 100 μm, preferably between 10 nm and 50 nm, and e1 and e2 are for example between 20 nm and 100 μm.

The actuation beam(s) can be made with materials suitable for making a MEMS and/or NEMS structure. The actuation force generated by a beam depends on the product of the expansion coefficient α and the Young modulus E. This product is preferably maximised.

For example, for silicon:

$$\alpha = 2.6 \frac{ppm}{K}$$

and E=169 GPa, for silicon nitride:

$$\alpha = 3.26 \frac{ppm}{K}$$

and E=1125 GPa and for silicon carbide:

$$\alpha = 4 \frac{ppm}{K}$$

and E=450 GPa. Silicon carbide is particularly advantageous.

The MEMS and/or NEMS structure is to be connected to an electric current source or voltage source designated by $I_0$ for example by contact pads made in the fixed part on either side of the movable part. This source S can be an AC or DC source.

In the following of the description and for the sake of simplicity, an electrical current source is only considered, which will be designated by "current source".

The operation of the structure S1 will now be described.

A current $I_0$ is applied to the structure S1, this passes through the actuation beam 6, flows in the movable part 4 and passes through the connecting element 8, which mainly causes the actuation beam 6 to be heated by Joule effect. Thereby, a mechanical stress appears within the actuation beam 6 at the anchors by a repulsive force which is exerted on them. This force is generally directed along the main axis of the beam. An extension of the actuation beam results therefrom by thermoelastic effect. Since the actuation beam 6 is connected to the movable part 4 which is free to be moved along the axis X and the connecting element 8 has a large flexibility along the direction X, thereby there is a movement of the movable part 4 along the axis X towards the connecting element 8.

Because the thickness of the actuation beam is much lower than those of the movable part, the resistance of the beam is higher than that of the movable part which enables the current to access the actuation beam.

There is a current density concentration in the actuation beam, which promotes a higher temperature rise in the same in comparison with the fixed and movable parts. The power provided is mainly used to heat the beam and thus to generate a force by electrothermal effect. This force is all the more large that heating is large. A better energy efficiency is thereby obtained.

If the current is an AC current, the movable part is vibrated. The vibration frequency can be all the more high that the thermal time constant of the actuation beam is low, this is particularly the case when it has small dimensions. Preferably, the length is between 100 nm and 20 μm.

The thickness of the fixed part is not taken into account, because it has a very large area with respect to that of the movable part and of the connecting element, consequently its resistance is typically much lower than those of the movable part and the connecting element. Further, dimensioning requirements imposed by the MEMS specification are applied to the movable part. For the connecting element, it is not or poorly contemplatable that it has a large width, otherwise it could disturb the mechanical operation of the structure.

By way of example, let us consider a MEMS and/or NEMS structure in which the actuation beam has a thickness of 0.25 μm, a width of 0.25 μm and a length of 5 μm and in which the connecting element has a thickness of 1 µm, a width of 2 µm and a length of 50 µm. Let us further consider that the access resistance is mainly that of the connecting element. In addition, the actuation beam and the connecting element are made of the same material.

$$\text{The efficiency: } r = \frac{Pbeam}{P \text{ total}} = \frac{Rbeam}{R \text{ beam} + Raccess} = 96\%$$

The implementation of an actuation beam having a small thickness advantageously enables resistances of the beams of several thousands of Ohm to be reached. Such resistances enable actuation currents in the range of 100 µA-1 mA to be reached using a generator in the order of 1 V. The current delivered by the generator is close to or within the current range aimed at. Under these conditions, most of the power delivered by a generator of 1V is transmitted to the actuation beam without resorting to DC-DC converters.

For example, for an actuation beam having the dimensions 0.25 µm×0.25 µm×5 µm, the electric resistance R of the actuation beam is:

R=4 100Ω with doping 2×10$^{19}$ cm$^{-3}$.
R=1 860Ω with doping 5×10$^{19}$ cm$^{-3}$.

The current also passes through the connecting element 8 which ensures closing of the electric circuit. The connecting element 8 also undergoes self-heating but because of its spring configuration, the different branches perpendicular to the axis X can freely expand and the force exerted by the connecting element 8 onto the movable part 4 is negligible with respect to that exerted by the actuation beam 6. Moreover, by choosing a connecting element the stiffness of which is small in the direction X with respect to the stiffness of the MEMS and/or NEMS structure, the thermoelastic deformation mainly takes place on the connecting element 8. A very low actuation force is exerted thereby on the movable part 4.

Since the connecting element 8 has a thickness much higher than that of the actuation beam, it also has a low electric resistance, its self-heating is reduced with respect to the beam. The resulting electrothermal force can for example be at least by one order of magnitude lower than that generated in the actuation beam. Preferably, the electric resistance of the suspending element(s) is at least five times lower than that of the actuation beam(s). By combining the small electrical resistance of the connecting element and the small stiffness of the connecting element, the effect of the connecting element onto the movable part because of the forces generated by electrothermal effect in the connecting element is very small.

Alternatively, the material of the connecting element could be doped to have a better electrical and thermal conductivity than that of the material of the actuation beam or be made in a material having a lower expansion coefficient than that of the material of the actuation beam.

Means for detecting motions of the movable part which are generated by the electrothermal force can be provided, for example in an application with one sensor. The actuation beam(s) can be made of a piezoresistive material forming the detecting means. The variation in the electrical resistance of the beams enables the motion of the movable part to be known. Alternatively, this could be a piezoelectric material.

The structure S1 can comprise several parallel actuation beams 6 disposed side by side.

Preferably, the actuation beam(s) have a length higher than or equal to at least 10 times their largest transverse dimension. The ratio of the length to the largest transverse dimension is advantageously between 5 and 200. It is to be noted that the higher the length of the actuation beam, the more the operating range of the actuation beam decreases because of the buckling phenomenon.

In dimensioning the actuation beam(s), the buckling limit is taken into account. The buckling limit decreases as L$^2$: for example, for a beam which is 12 µm long, the maximum compression allowed stress is 300 MPa for a cross-section of 250 nm×250 nm. In this particular case, the ratio L/t reaches 48. The stresses searched for to perform actuation can reach several hundreds of MPas for the strongest values.

Long actuation beams offer a better performance.

Indeed, one or more long actuation beam(s) has (have) a larger electric resistance. The global efficiency of the Joule power can thereby be improved and the necessary currents can be low which is favourable, which enables the power provided by the current source to be reduced for a same performance.

One or more long actuation beam(s) offer(s) a larger heat insulation which enables the self-heating effect to be increased when an electric current passes at a constant electric power, or the electric consumption to be decreased at a constant electrothermal force.

Particularly advantageously, the actuation beam(s) is (are) formed by a nanowire the width and/or thickness of which is (are) lower than or equal to 500 nm.

Indeed, with such dimensions, the nanowire has thermal conductivities lower than those of the volume material because the phonon-phonon or phonon-surface type interaction process is intensified. For example, in the case of silicon, a reduction by a factor 3 can be observed for nanowires of a cross-section 250 nm×250 nm, the nanowires have a thermal conductivity of 50 W/m/K whereas the solid silicon has a thermal conductivity of 140 W/m/K.

The temperature profile T(x) within a beam of a length L through which a current of density j passes can be approximated by:

$$T = T_0 + \frac{\rho j^2}{2\kappa} x(L - x).$$

ρ is the resistivity, κ the thermal conductivity. The maximum temperature is reached in the middle of the beam:

$$\Delta T_{max} = \frac{\rho j^2}{8\kappa} L^2.$$

Since the self-heating amplitude is inversely proportional to the thermal conductivity, a nanowire having a nanoscale cross-section, for example the width and/or thickness of which is (are) between 10 nm and 500 nm, thus benefits from an amplified heating and thus from an amplified actuation force by unit area (cross-section of the beam), in comparison with an actuation beam with higher dimensions.

Actuation beams in the form of microbeams of a few µms with transverse dimensions and length for example between 5 µm to 10 µm have the advantage to have a reduced thermal inertia with respect to actuation beams of microsystems of the state of the art, the response times in generating the force are thereby shorter during an electrical load. Such actuation beams enable MEMS and/or NEMS structures to be made with high resonance frequencies, for example in the frequency range from 1 MHz and 1 GHz.

Figure 2:
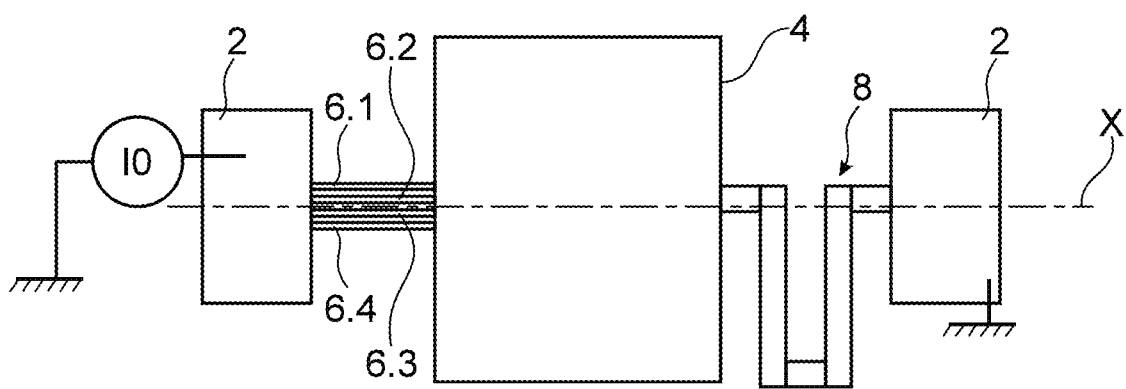
FIG. 2 is a top view of another exemplary embodiment of a MEMS and/or NEMS structure implementing nanowires.

In FIG. 2, a MEMS and/or NEMS structure can be seen comprising several actuation beams 6.1, 6.2, 6.3, 6.4 as nanowires disposed in parallel next to each other.

The configuration in which several nanowires representing in total the same cross-section as a single actuation beam is particularly advantageous, because at a constant total cross-section, the electric power consumed is identical to that consumed by a single actuation beam, the mechanical stiffness exerted onto the structures at the ends of the nanowire is equivalent, but because of the amplification described above, the total force exerted by the nanowires is amplified with respect to that applied by a single actuation beam.

This structure thereby has an improved energy efficiency.

If n nanowires replacing a beam are considered, which have the same cross-section and the same length, there is for the nanowire i: $R_i = nR_p$ with $R_p$ the resistance of the beam.

The power in a nanowire is thereby written as $$P_i = R_i \times \left(\frac{I}{n}\right)^2 = \frac{R_p I^2}{n},$$

that is the total power in the n nanowires $= \Sigma_i^N P_i = R_p I^2$, that is the power consumed by the beam with an equivalent total cross-section.

The stiffness of a nanowire $$k_i = \frac{k_p}{n},$$

with $k_p$ the stiffness of the beam, that is an equivalent longitudinal stiffness $k = k_p$ is identical to the stiffness of the beam with an equivalent total cross-section.

The time constant for each nanowire is written as $\tau_i = R_{th,i} C_i = R_{th} C$ in the case where the material parameters are unchanged.

With $$R_{th} = \frac{L}{S\kappa}$$
$$C = cLS$$
$$R_{thi} = \frac{nL}{S\kappa_i}$$
$$C_i = \frac{cLS}{n}$$

c is the thermal capacity per unit volume, C is the thermal capacity of the actuation beam, $C_i$ is the thermal capacity of a nanowire, $\kappa$ the thermal conductivity of the actuation beam, $\kappa_i$ is the thermal conductivity of the nanowire, S the cross-section of the actuation beam and S/n the cross-section of a nanowire, L the length of the actuation beam and of a nanowire. In practice, the time constant or response time slightly increases since the thermal conductivity decreases. This increase can be at least partly compensated for by reducing the length of the nanowire. The response time of a nanowire can be higher than that of a thicker nanowire because of the decrease in the thermal conductivity.

The nanowires can for example be made by planar etching techniques which enable beam widths in the order of 100 nm to be reached using the deep ultra violet etching method or 5 nm using the e-beam lithography method, while preserving identical dimensions for the rest of the MEMS/NEMS structures.

The thickness of the nanowires can be obtained by implementing a structural layer finer than that used for the rest of the MEMS structure. Such a manufacturing method implementing two structural layers is well known to those skilled in the art.

The structure according to the invention makes it possible to have an actuation beam(s) with a reduced size in comparison with the movable part it (they) move(s) while preserving a proper actuation efficiency. For example, the ratio between the areas of the planar structures of the MEMS (these areas comprise that of the movable part and of the fixed tracks used for biasing) and of the beam can typically reach factors of 1000-10000. In terms of volume, the ratio can be between 10000 and 100000.

Figure 3A:
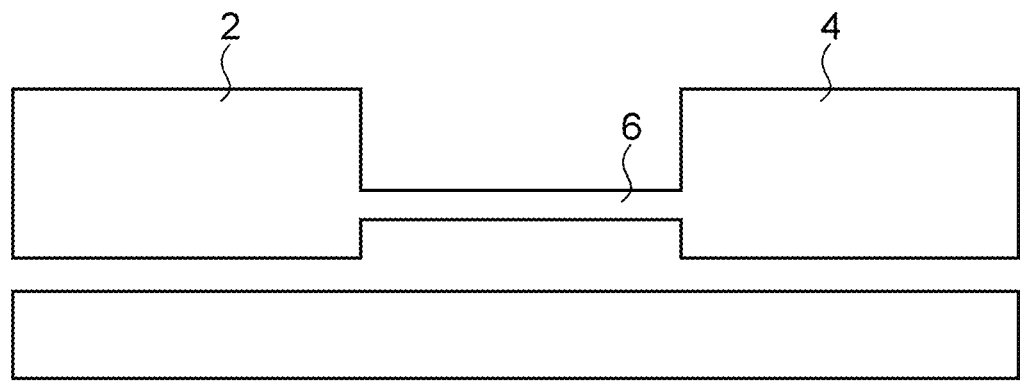
FIGS. 3A and 3B are longitudinal cross-section views of two MEMS and/or NEMS structures according to two alternative embodiments, in which the actuation beam is at different positions.
Figure 3B:
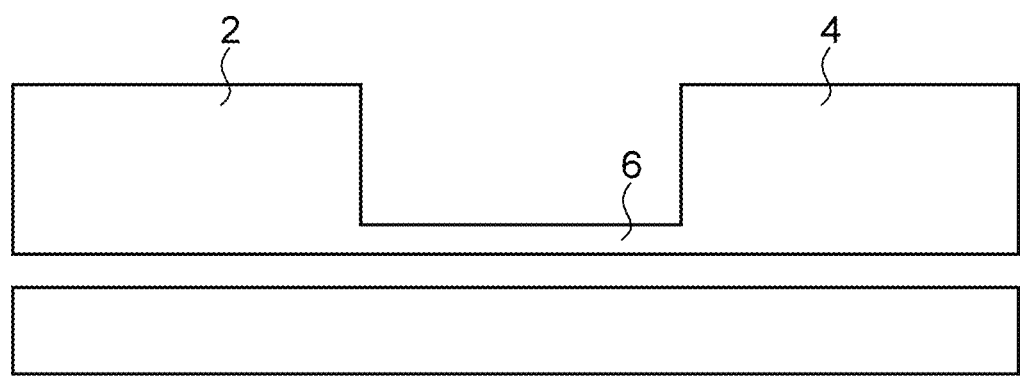

In the example represented in FIG. 1B, the actuation beam 6 is substantially located in the median plane of the movable part 4. This arrangement is not limiting. In FIG. 3A, the actuation beam 6 is located below the median plane in the movable part 4. In FIG. 3B, the actuation beam 6 is located above the median plane, its upper face being in the plane of the upper face of the movable part 4. These configurations are not limiting and any other configuration is contemplatable.

Figure 4A:
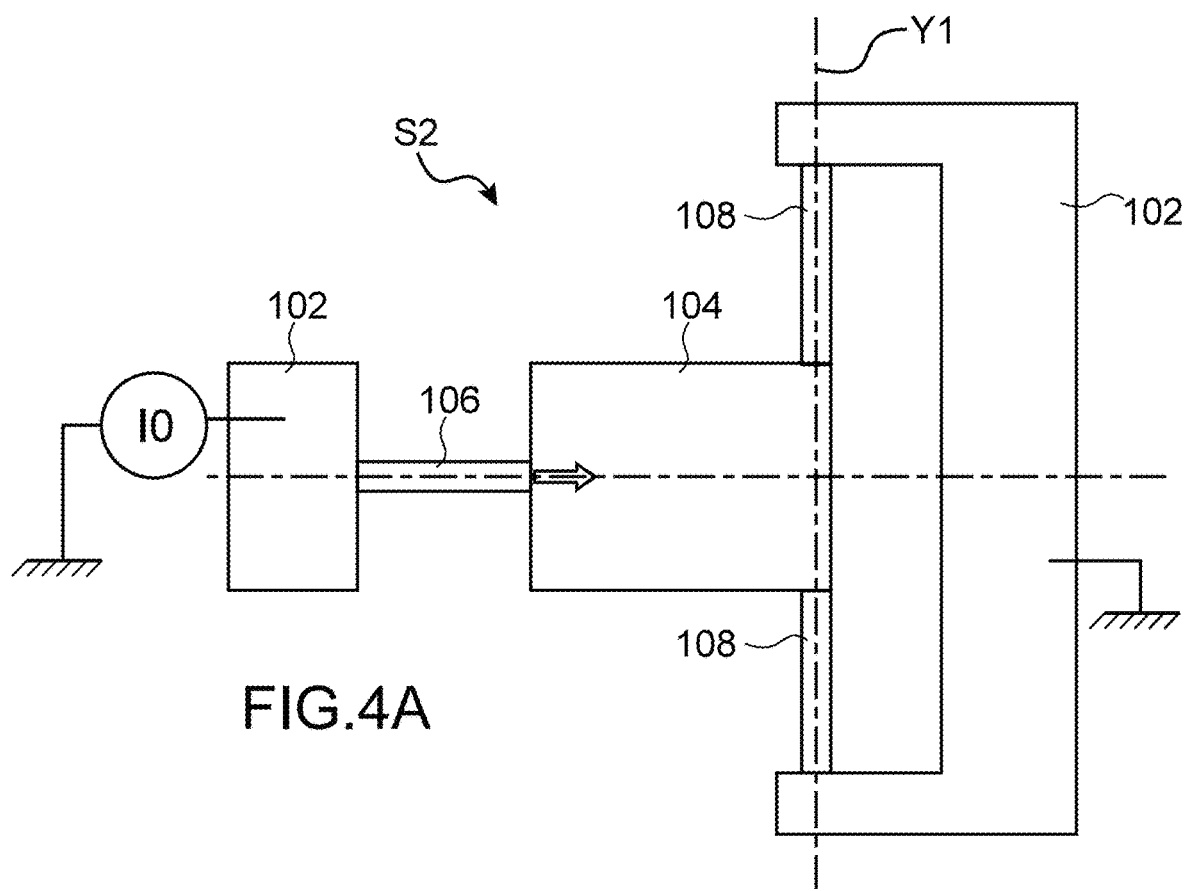
FIG. 4A is a top view of another exemplary embodiment of a MEMS and/or NEMS structure.

In FIG. 4A, another example for making a MEMS and/or NEMS structure S2 can be seen. The structure S2 differs from the structure S1 in that it comprises two connecting elements 108 formed by beams and extending perpendicular to the axis of the actuation beam on either side of the movable part. The connecting elements 108 are aligned along an axis Y1. In the example represented, the connecting elements 108 are located at the longitudinal ends of the edges of the movable part 104 which are parallel to the axis X, on the opposite side of the movable part 104 to which the actuation beam 106 is connected. In this example, a part of the fixed part 102 is U-shaped to enable the connecting elements to be connected to the fixed part 102.

The actuation of this structure S2 is similar to that of the structure S1 except that the current flows in both connecting elements 108. Both connecting elements 106 are heated and an electrothermal force appears in both of them. But because of their facing position along the axis Y1, the electrothermal forces in the connecting elements 108 compensate for each other. The electrothermal force appearing in the actuation beam along the axis X ensures a movement of the movable part along the axis X. The dimensioning of the connecting elements 108 is such that they bend in-plane under the effect of the electrostatic force. The actuation of the movable part 6 is thus not disturbed by the self-heating of the connecting elements.

The motion detection of the movable part can be made using the connecting elements of the structure S2 made for example of a piezoresistive material.

Figure 4B:
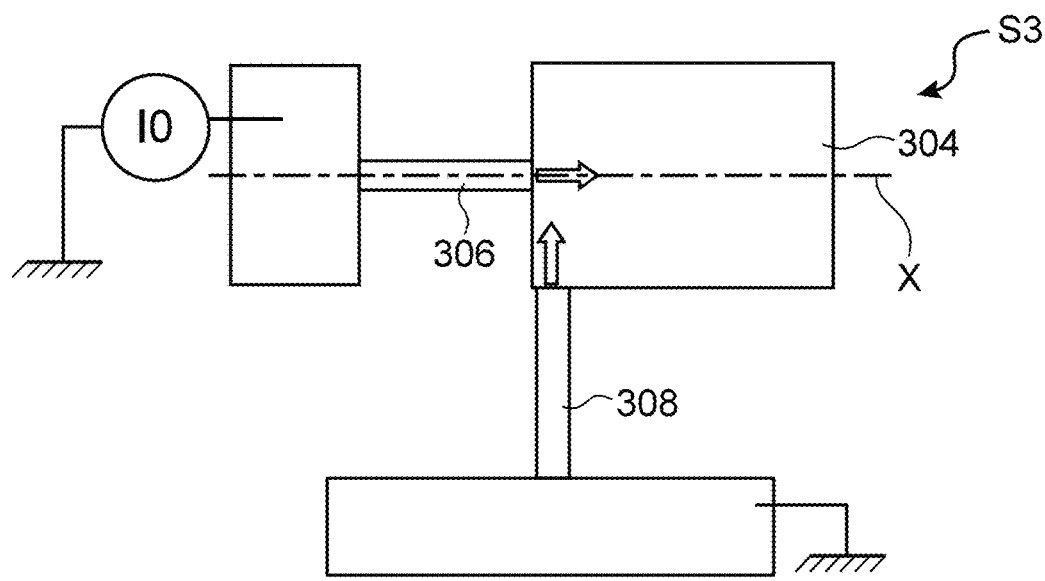
FIG. 4B is a top view of an alternative of the structure of FIG. 4A.

In FIG. 4B, another exemplary embodiment of a MEMS and/or NEMS structure S3 comprising a single connecting arm 308 with an axis perpendicular to the axis X can be seen. In the example represented, it is located at the longitudinal end of an edge of the movable part 304 parallel to the axis X on the side of the actuation beam 306.

Figure 5A:
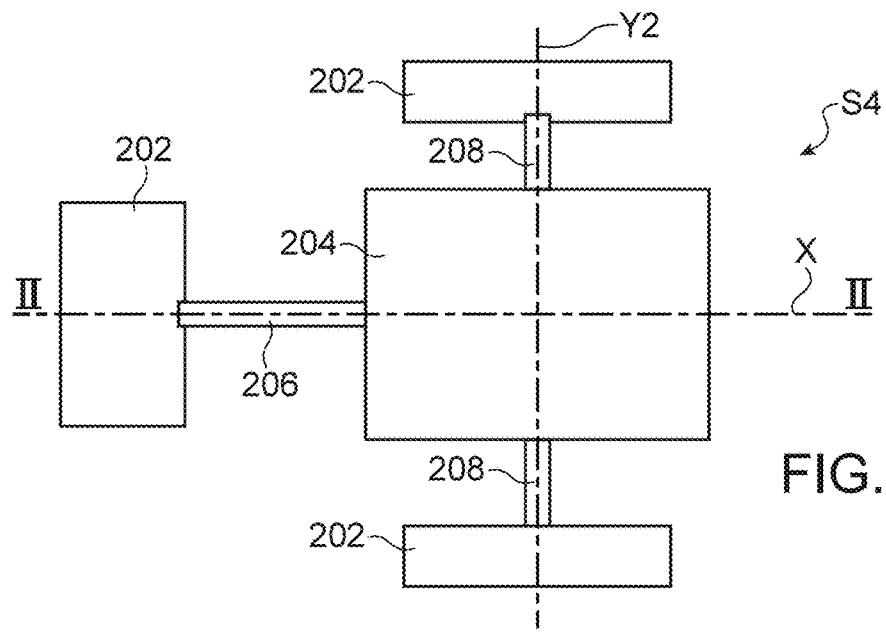
FIG. 5A is a top view of an exemplary embodiment of a MEMS and/or NEMS structure according to the invention with an out-of-plane rotational motion.
Figure 5B:
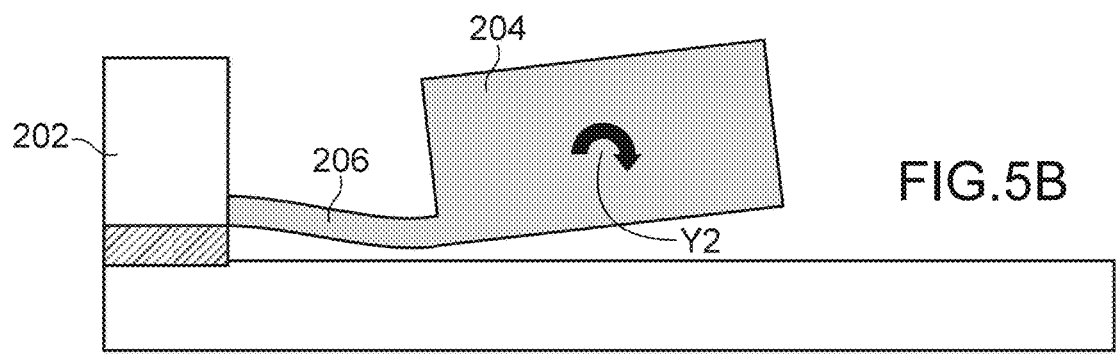
FIG. 5B is a longitudinal cross-section view of the structure of FIG. 5A along a plane II-II currently actuated.

In FIGS. 5A and 5B, another example of a structure S4 allowing an out-of-plane movement can be seen. The structure S4 comprises two connecting elements 208 formed by beams and extending perpendicular to the axis of the actuation beam 206 on either side of the movable part 204. In the example represented, the connecting elements 208 are aligned along an axis Y2 and are located substantially in the middle of the sides of the movable part 204 which are parallel to the axis X. Further, the actuation beam 206 comprises a lower face in the same plane as the face of the movable part facing the substrate. On the other hand, the axis Y2 and the actuation beam 206 are in different planes, for example the connecting elements 208 are located in the median plane of the movable part 204. The axis of rotation is approximately located in the median plane of the elements 208.

The connecting arms 208 are made so as to have a sufficient bending stiffness and be torsionally deformable in order to form an axis of rotation for the movable part as can be seen in FIG. 5B. Indeed, the electrothermal force which appears within the actuation beam 206 is exerted on the movable part 204 which is attached to the fixed part 202 by the connecting elements 208, which are torsionally deformed about the axis Y2. The movable part 204 thereby pivots about the axis X.

In this exemplary embodiment, the movable part 204 can only pivot in the anti-clock wise direction from its rest position.

The actuation beam can be located in any position with respect to the movable part which is different from the plane containing the axis of rotation, i.e. the axis Y2 of the connecting arms 206.

This out-of-plane actuated structure is particularly advantageous because the out-of-plane actuation is difficult to carry out with the structures of the state of the art, for example with a capacitive type actuation. Indeed, in a structure comprising interdigitated comb type capacitive electrodes, the mechanical moment at an axis de rotation located at the median plane of the MEMS structure is null. Planar electrodes located above or below the MEMS have thereby to be added, which complexifies the manufacture.

Figure 6:
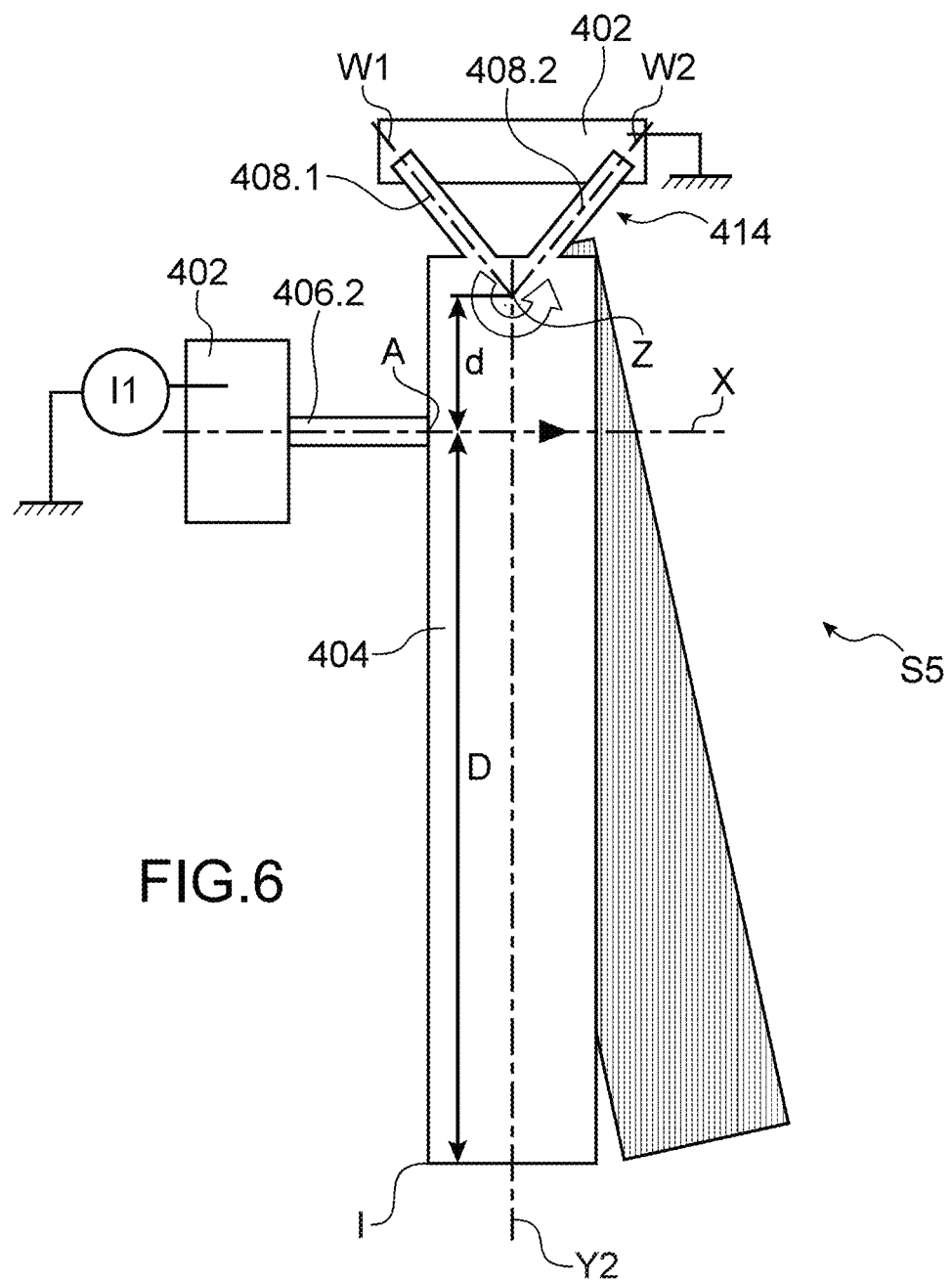
FIG. 6 is a top view of an exemplary embodiment of a MEMS and/or NEMS structure according to the invention with an in-plane rotational motion.

In FIG. 6, another exemplary embodiment of a structure S5 wherein the movable part is rotatably hinged in-plane can be seen.

The structure S5 comprises a fixed part 402, a movable part 404, rotatable hinge means 414 for the movable part 404 with respect to the fixed part, and an actuation beam 406 between the fixed part and the movable part.

The hinge comprises an axis of rotation Z perpendicular to the plane of the structure and two arms forming two connecting elements 408.1, 408.2. Both connecting elements 408.1, 408.2 are connected to the fixed part 402 and to the movable part 404 and are tilted with respect to each other such that their axes W1, W2 are secant at the movable part 404, the axes W1 and W2 being secant in Z. By way of non-limiting example, the angle between the axes W1 and W2 can for example be equal to 90°.

The axis X of the actuation beam and the axis of rotation Z are not secant, such that an electrothermal force applied along the axis X causes a rotation of the movable part about the axis Z. The movable part 404 is moved in the anti-clock wise direction under the effect of the force, the movable part thereby assumes the position represented in dotted lines and in the clockwise direction when the force terminates.

The thickness of the actuation beam 406 is lower than or equal to half the thickness of the movable part 404 and the thickness of the connecting elements 408.1, 408.2.

A self-heating of the actuation beam 406 thus causes a rotation of the movable part 404 about the axis Z.

Figure 7:
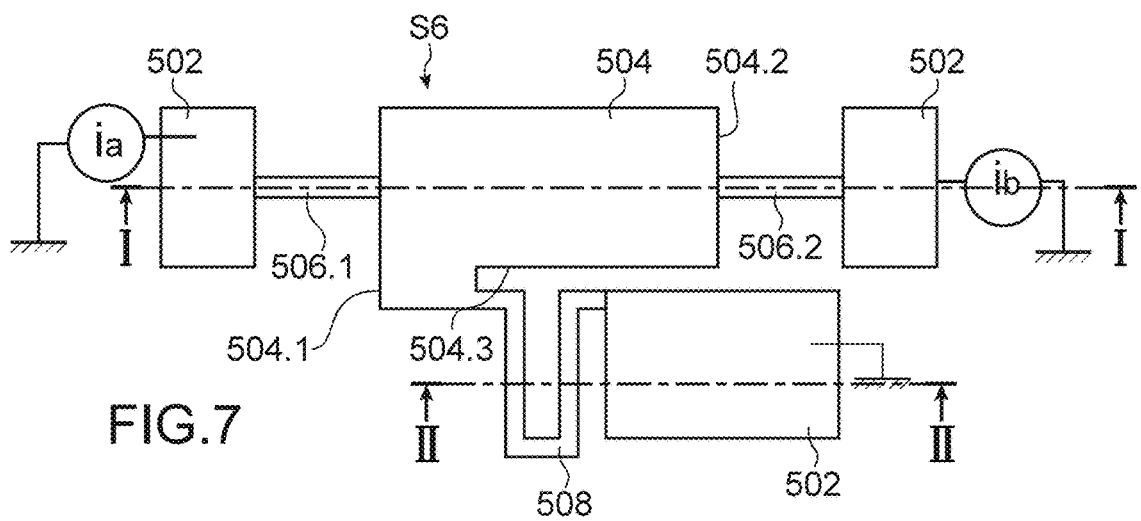
FIG. 7 is a top view of an exemplary embodiment of a MEMS and/or NEMS structure according to the invention comprising two actuation beams each activated by a different current source.

Preferably and as is represented in FIG. 7, the structure S6 enables the movement amplitude of a point I located on the movable part opposite to the axis Z with respect to the axis X of the beam to be amplified.

Indeed, if the distance d, between the intersection point between the axis X and an axis Y2 forming the longitudinal axis of the movable part 404 and the intersection point of Z and Y2, and the distance D between and the intersection point of Z and Y2 and the point I are considered, the movement amplitude of point I is amplified with respect to that of the intersection point between the axis X and axis Y2 by a ratio D/d.

Ratios in the order of 10 to 200 can be readily obtained. Amplitudes in the order of about ten nanometres at the actuation beam can cause movements of point I by more than 1 µm.

Such a structure can for example be implemented to move the inertial masses of a gyrometer for which the vibration amplitudes can reach more than 1 µm.

Figure 12:
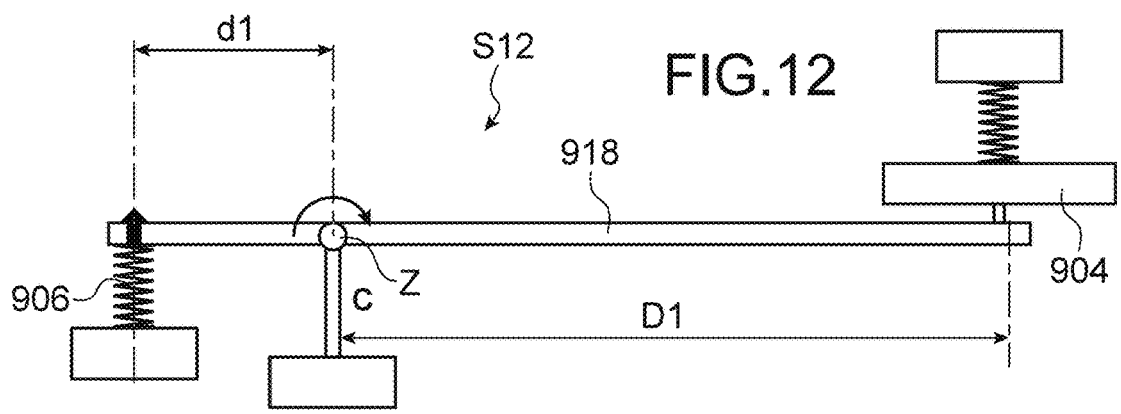
FIG. 12 is a schematic representation of a MEMS and/or NEMS structure comprising means for modifying the intensity of the force applied to the movable part by an electrothermal actuation beam.

In FIG. 12, another exemplary embodiment of a structure S13 which is schematically represented enables the force applied to the movable part of the structure to be adapted and a movement amplitude of the actuation beam to be amplified.

The structure S13 implements a lever arm 918 hinged about an axis Z perpendicular to the plane of the structure. An actuation beam 906 is disposed on one side of the axis of rotation and on one side of the lever arm and the movable part 904 is disposed on the other side of the lever arm and on the other side of the axis of rotation.

By designating d1 the distance between the axis of rotation and the point of application of the electrothermal force Fp on the lever arm and D1 the distance between the axis of rotation and the point of application of the force Fm of the lever arm on the movable part 904, $$Fm = d1/D1 \times Fp.$$

It is possible to reduce the intensity of the force applied to the movable part.

This structure S13 makes it possible to have a movement applied to the movable part which is amplified with respect to that of the actuation beam by a ratio D1/d1.

Alternatively, the axis of rotation of the lever arm can be parallel to the plane of the structure, for example by making a torsionally deformable axis of rotation.

FIG. 7 show another exemplary embodiment of a structure S6 which is particularly advantageous enabling at least two different electrothermal forces to be applied.

In the example represented, the structure S6 comprises a fixed part 502, a movable part 504, a first actuation beam 506.1 extending between the fixed part and an edge 504.1 of the movable part 504, a second actuation beam extending between the fixed part and an edge 504.2 of the movable part 504 opposite to the edge 504.1, and at least one connecting element 508 between the movable part 504 and the fixed part 502. The connecting element 508 in the example represented extends at an edge 504.3 of the movable part perpendicular to the edges 504.1 and 604.2. It further has the shape of a spring in the form of slots. Alternatively, the actuation beams could be connected to two consecutive sides of the movable part or to the same side and the connecting element could be connected to any side of the movable part.

The actuation beams have a thickness lower than or equal to half the thickness of the movable part and the thickness of the connecting element.

Each actuation beam 506.1, 506.2 is such that a current Ia, Ib passes therethrough respectively. For example, two distinct current sources are each connected to a contact pad located on the fixed part 502 in proximity of the actuation beams 506.1, 506.2. The contact pads are electrically insulated from each other at the substrate. This supply to each actuation beam with a different current is made possible by the presence of the connecting element which forms a distinct conduction path of the actuation beams, and enables the currents Ia and Ib to flow through the connecting element to the fixed part. The current Ia+Ib thus passes through the connecting element.

Each current Ia, Ib can be separately controlled and enable the generation of different electrothermal forces in each actuation beam. For example, the currents Ia and Ib can be slot signals in opposite phase or sinusoidal currents for example also in opposite phase. It is thereby possible to have a constructive interference of the electrothermal forces applied by both aligned actuation beams.

As explained for the structure S1, the self-heating of the connecting element 508 does not oppose the movement of the movable part 504, since the arms of the connecting element 508 can freely expand.

This exemplary embodiment has the advantage to enable structures in which both electrothermal actuation beams are aligned to be made, which is not contemplatable in structures of the state of the art, otherwise the forces would opposite each other.

Further and very advantageously, the movable part can be moved to the right or to the left from its balance position by activating either of the actuation beams. The activating current I1 or I2 flowing in the connecting element 508 and not in the other actuation beam, there is no generation of a force in the other actuation beam which would oppose the movement of the movable part. In the electrothermally actuated structures, such movements in one direction or in the opposite direction on demand from a balance position are not contemplatable.

It will be understood that each actuation beam can be replaced by several actuation beams disposed in parallel from the electrical point of view and which would be activated by the same current source.

Figure 8:
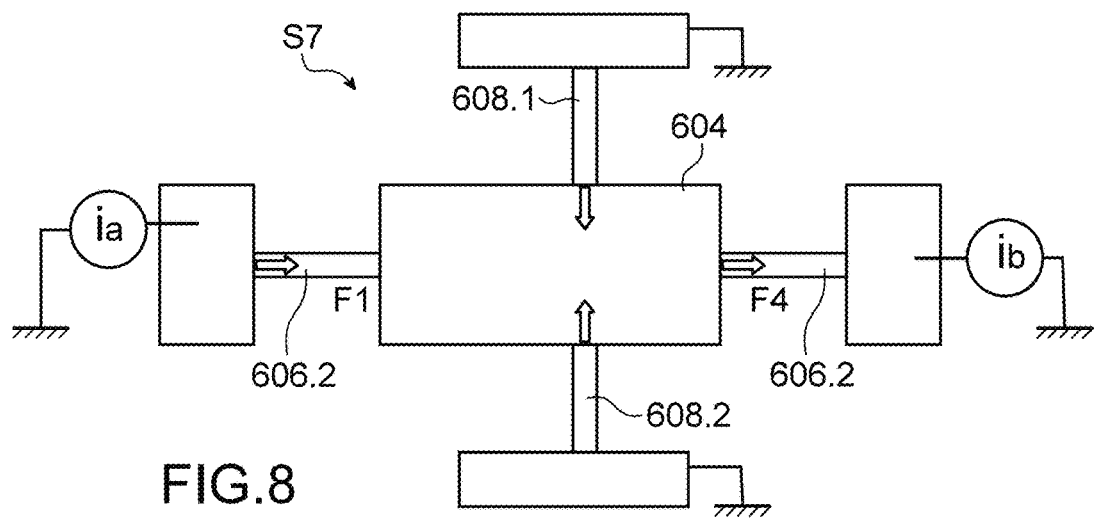
FIG. 8 is a top view of another exemplary embodiment of a MEMS and/or NEMS structure with two actuation beams each activated by a different current source.

In FIG. 8, another exemplary structure S7 that can be actuated by two actuation currents can be seen.

The structure S7 is close to the structure S4 but it comprises a second actuation beam 606.2 aligned with the actuation beam 606.1 and opposite to the beam 606.1 with respect to the movable part 604. As for the structure S6, currents Ia, Ib pass through the actuation beams 606.1, 606.2 respectively and then flow to the fixed part through the connecting elements 608.1, 608.2. The electrothermal forces generated in the connecting elements 608.1, 608.2 are compensated for each other and do not disturb the movement of the movable part.

A structure comprising n actuation beams, n being at least equal to 2 and m connecting elements, m being at least equal to 1, and q independent current sources, q being between 2 and n comprised, flowing in the n actuation beams, does not depart from the scope of the present invention.

The implementation of at least two actuation beams through which different currents pass can for example be applied to the structure S6 in which the movable part is rotatably hinged in-plane. For example, a second actuation beam aligned with the actuation beam 406 could be provided.

In all the exemplary embodiments comprising several actuation beams and/or several connecting elements, the actuation beams can have equal or different dimensions and the connecting elements can have equal or different dimensions and similar or different shapes.

Figure 9C:
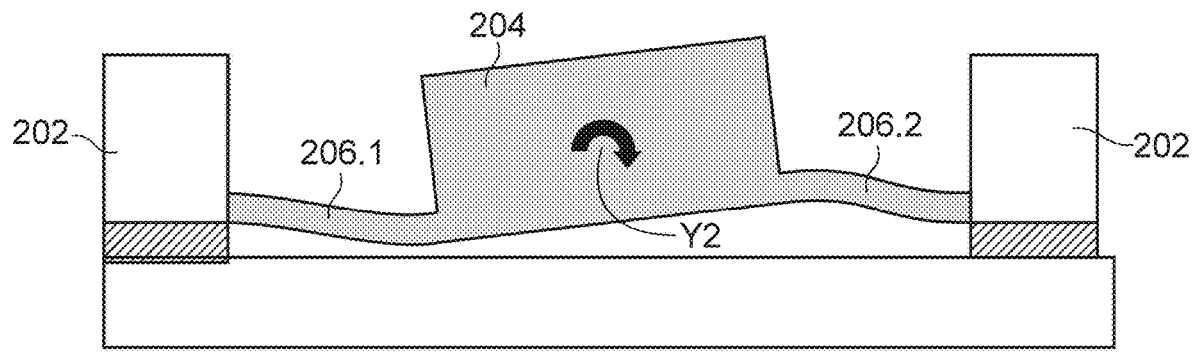
FIG. 9C is a side view of a structure similar to that of FIGS. 5A and 5B implementing two actuation beams that can be separately activated.
Figure 9A:
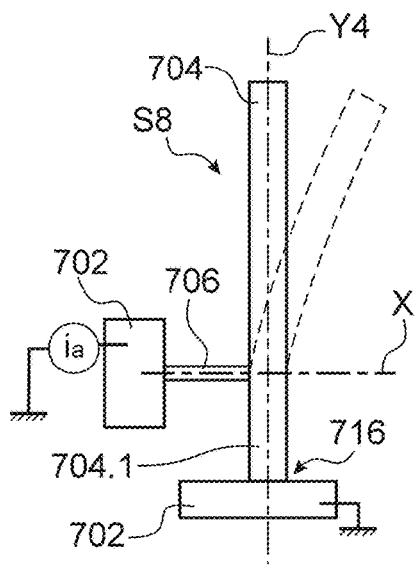
FIGS. 9A and 9B are top views of two MEMS and/or NEMS structures according to another exemplary embodiment in which the movable part is bending deformed.

In FIG. 9A, another exemplary embodiment of a MEMS and/or NEMS structure S8 wherein the movable part is mechanically deformed by the action of the actuation beam can be seen.

The structure S8 comprises a fixed part 702, a movable part 704 and an actuation beam 706 extending on a direction X.

In the example represented, the movable element extends along a direction Y4 in-plane and perpendicular to the axis X. The movable part 704 is secured to the substrate by a longitudinal end 704.1 by an embedded link 716. The movable part is dimensioned to be bending deformed under the effect of the electrothermal force applied by the actuation beam.

The embedded link replaces the connecting element, the actuation current flowing through the beam and the fixed beam.

When an actuation current flows in the actuation beam 706, this self-heats by Joule effect which generates an electrothermal force which is applied to the movable part 704. Because of the perpendicular direction of the electrothermal force with respect to the axis of the movable part, this is bending deformed as represented in dotted lines in FIG. 9A.

Any other orientation of the actuation beam with respect to the movable part causing the deformation of the movable part according to another mode than a bending mode and/or in an out-of-plane direction does not depart from the scope of the present invention.

Figure 9B:
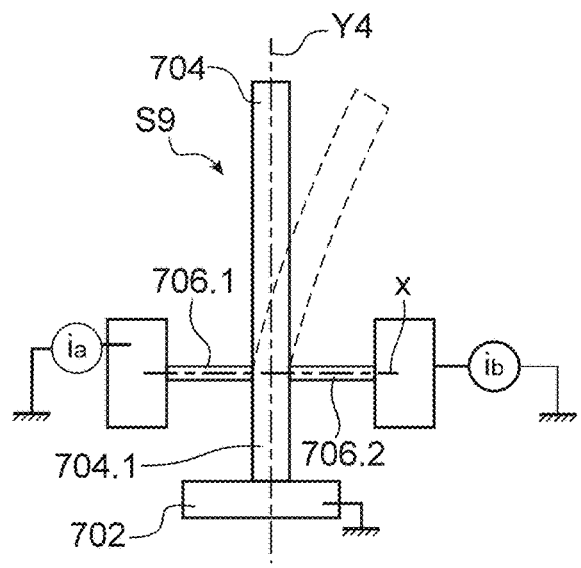

In FIG. 9B, another exemplary embodiment of a structure S9 in which the movable element 704 is also for being bending deformed can be seen. The structure S9 comprises two actuation beams 706.1 and 706.2, aligned in the example represented and through which two different currents Ia, Ib pass.

As for the structure S8, the beams are perpendicular to the axis of the movable element causing, by applying the electrothermal forces, a deformation according to a bending mode.

It can be contemplated that the beams are not aligned, thereby causing several deformation zones of the movable part.

In FIG. 9C, a structure similar to that of FIGS. 5A and 5B implementing two actuation beams 206 disposed on either side of the movable part 904 can be seen, the activation of either of the beams enables the movable part to be pivoted about the axis of rotation in the clockwise direction and the anti-clockwise direction.

Figure 10:
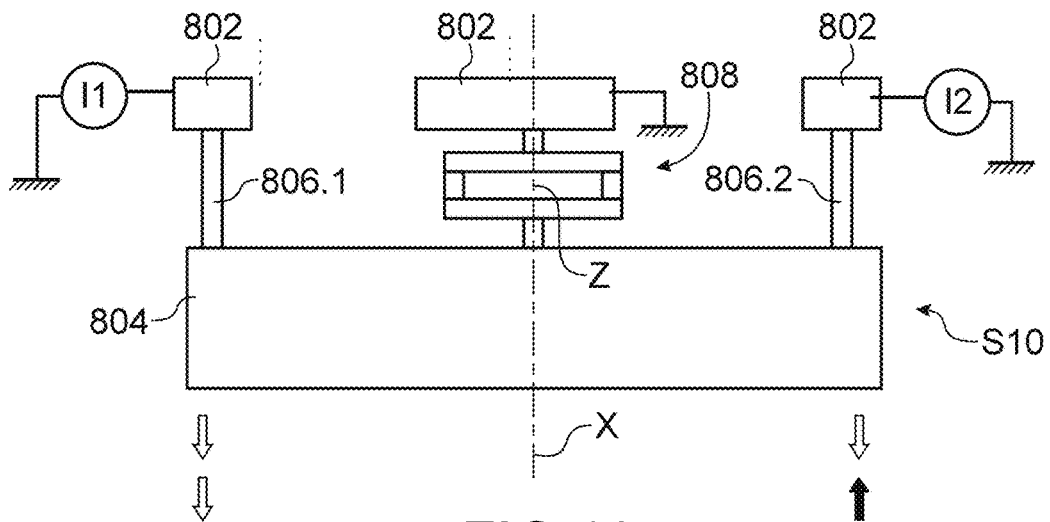
FIG. 10 is a top view of another exemplary embodiment of a MEMS and/or NEMS structure with two actuation beams each activated by a different current source.

In FIG. 10, another example of a MEMS and/or NEMS structure S10 implementing two actuation beams can be seen.

The structure S10 comprises a fixed part 802, a movable part 804, two parallel actuation beams 806.1, 806.2 connected to a same side of the movable part and a connecting element 808 also connected to the same side of the movable part as the actuation beams. The connecting element 808 has some elasticity enabling the structure 804 to be displaced in-plane translationally along X and enables the mass to be pivoted about the direction Z.

This structure enables mechanical modes desired to be excited to be precisely controlled. For example, the amplitude and phase in the case of sinusoidal signals of currents passing through the actuation beams can be adapted in order to favour excitation of a given mechanical mode.

For example, in the case of in-phase continuous actuation currents in both actuation beams 806.1, 806.2, the movable part 804 translationally moves along the axis X. In the case of anti-phase continuous actuation currents, the movable part is rotatably moved about the axis Z.

The current flowing in the beam 806.1 is noted $I_1$ and the current flowing in the actuation beam 806.2 is noted I2.

In the case where continuous actuation currents are considered, by writing $I_1=i_a+i_b$ and $I_2=i_a+\varepsilon\times i_b$ given that the actuation force is proportional to the intensity squared, the force components are written as:

for the beam 806.1:

$F_1 \propto i_a^2+i_b^2+2i_a i_b$ for the beam 806.2:

$F_1 \propto i_a^2+i_b^2+2i_a i_b$ if $\varepsilon=1$, both forces are thereby in-phase. Both beams undergo the same self-heating and electrothermal forces with the same intensity are generated, the movable part is translationally moved. The connecting element 808 is deformed along the direction X.

$F_2 \propto i_a^2+i_b^2+2i_a i_b$ if $e=-1$, both forces thereby comprise an anti-phase term. Both beams does not undergo the same self-heating and electrothermal forces with different intensities are generated, the movable part is rotatably moved about the axis Z. The connecting element 808 is deformed about the axis Z. The actuation beam in which the highest electrothermal force is generated gives the direction of rotation of the movable part.

In the case where sinusoidal actuation currents are considered, by writing $I_1=i_a \sin \omega t$ and $I_2=i_a \sin \omega t+\varphi$, there is for the beam 1:

$$F_1 \propto i_a^2 \frac{1-\cos 2\omega t}{2}$$

for the beam 2:

$$F_2 \propto i_a^2 \frac{1-\cos 2\omega t + 2\varphi}{2}.$$

By choosing $$\varphi = \frac{\pi}{2}$$

for example, $F_1$ and $F_2$ are obtained in opposite phase for the component with $2\omega$ causing a rotation of the movable part.

A static phase component exists, as a result there is a position offset of the movable part with respect to its balance position.

By considering the structure S7 of FIG. 8 or S6 of FIG. 7, in which both actuation beams are aligned on either side of the movable part, the opposite phase resultant force applied to the movable part can be written as:

$\Sigma F \propto \cos 2\omega t$.

The structure S6 enables the static components to be cancelled.

Figure 11:
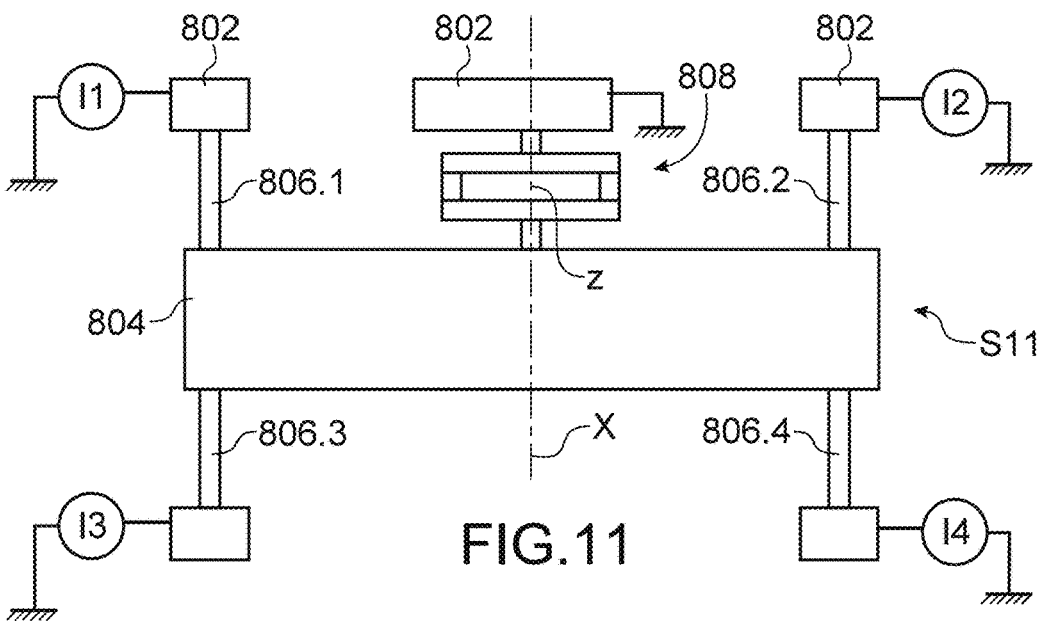
FIG. 11 is a top view of an exemplary embodiment of a MEMS and/or NEMS structure with four actuation beams each activated by a different current source.

In FIG. 11, another exemplary structure S11 with four actuation beams also enabling the static components to be cancelled can be seen. The structure S11 comprises, relative to the structure S10, two further actuation beams, a beam 806.3 aligned with the beam 806.1 and connected to the side of the movable part 804 opposite to that to which the beam 806.1 is connected and a beam 806.4 aligned with the beam 806.2 and connected to the side of the movable part opposite to that to which the beam 806.2 is connected.

Each actuation beam 806.1, 806.2, 806.3, 806.4 is supplied with its own actuation current I1, I2, I3, I4 respectively. Each current generates self-heating and electrothermal forces which are applied to the movable part.

By applying, for example, quadrature sinusoidal currents i1 and i3 and quadrature currents i2 and i4, it is possible to cancel the static components, wherein the movable part 804 can be translationally moved along the axis X.

If in addition, the currents i1 and i2 are in quadrature and i3 and i4 are in quadrature, the movable part 804 can be rotatably excited about the axis Z.

It will be understood that by choosing an adapted phase between the currents flowing in the different actuation beams, it is possible to optimise the excitation of a desired mode for any structure, for example in the case of structures comprising several movable parts, each with several degrees of freedom.

Further, very advantageously, the structures comprising at least two actuation beams as those represented in FIGS. 7, 8, 9B and 11, can enable the heat flow to be compensated for in view of the movable part and resulting from the application of the actuation current.

Indeed, in an electrothermally actuated structure of the state of the art, applying a voltage or current sinusoidal signal, a heat energy flow is applied to the structure which causes a modulation in the temperature of the structure and in particular of the movable part. This modulation can have effects on the structure mechanical response by modifying the stiffness of the connecting element.

In the case of an application to a slave pressure sensor, this temperature modulation can heat the gas the pressure of which varies with temperature. Such a temperature modulation disturbs measurements.

A structure with at least two actuation beams supplied with different currents can enable this structure temperature modulation to be avoided, or at least limited.

Figure 13:
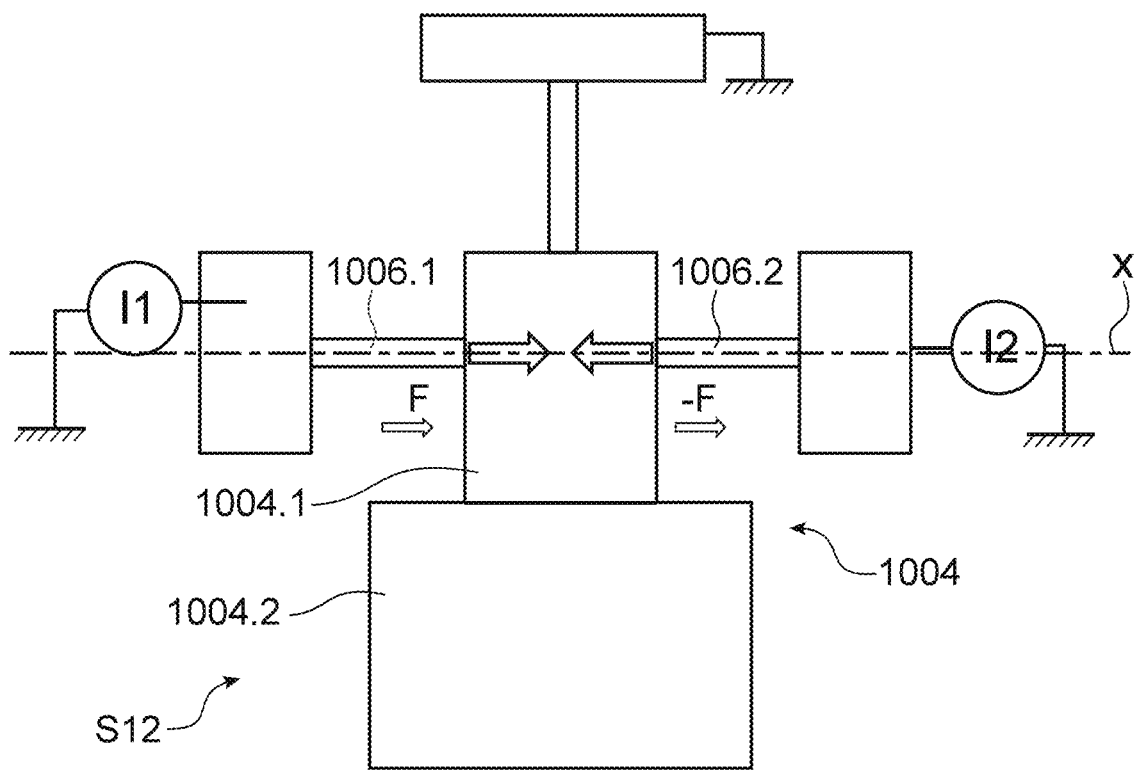
FIG. 13 is a top view of an exemplary embodiment of a MEMS and/or NEMS structure with two actuation beams each activated by a different current source, particularly suitable for compensating for the heat flow.

In FIG. 13, a structure S12 which is close to the structure S6 can be seen. In the structure S12, the connecting element is straight and not as a spring with slot. The actuation beams are aligned along the axis X on either side of the movable part 1004. Very advantageously, the longitudinal ends of the actuation beams 1006 which are anchored to the movable part 1004 are located at a short distance from each other. In the example represented, the movable part 1004 comprises a narrow part 1004.1 in the sense of the direction X between both actuation beams 1006.1, 1006.2, and a wide part 1004.2 located outside the space between the beams. The part 1004.2 can form the functional part of the movable part 1004 and the part 1004.1 can form the actuation or excitation part. The anchoring ends of the actuation beams 1006.1, 1006.2 on the movable part 1004 are thus close to each other. The distance separating the anchorings is for example 5 times lower than the dimension of the movable part in the alignment direction of the anchorings, it can for example be between 10 nm and 50 µm, preferably between 1 µm and 50 µm, preferably equal to 10 µm.

A current is applied to the actuation beam 1006.1 so as to cause heating of the beam $T_0+\Delta T$ and a current is applied to the actuation beam 1006.2 so as to cause heating of the beam $T_0-\Delta T$.

Figure 14:
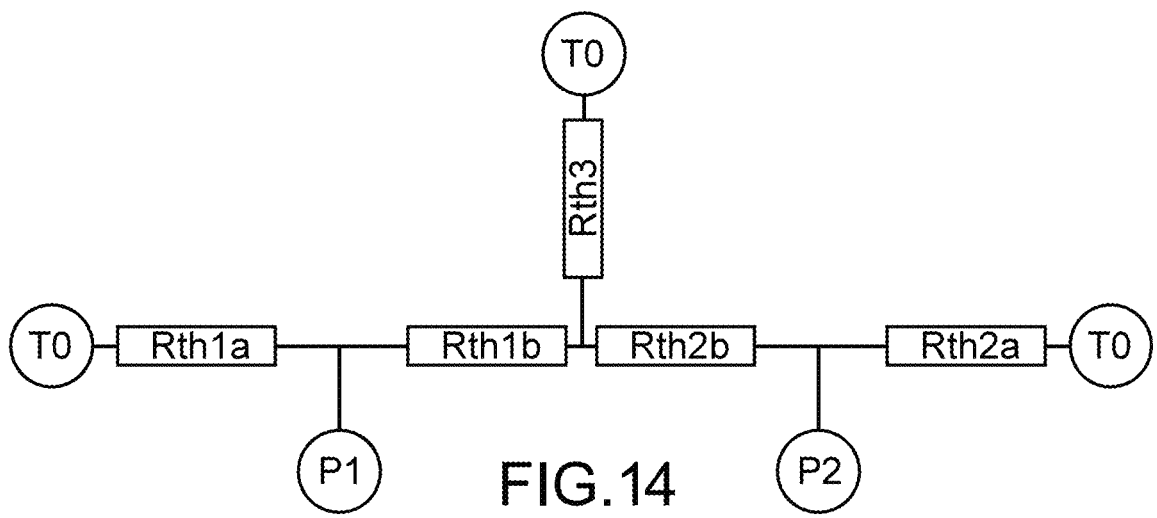
FIG. 14 is a representation of the heat scheme of the structure of FIG. 13.

In FIG. 14, the thermal circuit of the structure S12 can be seen.

Rth1a is given by the thermal resistance of the actuation beam 1006.1, Rth2a is given by the thermal resistance of the actuation beam 1006.2, Rth1b and Rth2b are thermal resistances which comprise a contribution of the actuation beams

1006.1 and 1006.2 of the movable part 1004. Rth3 is the thermal resistance of the connecting element.

By the effect of Joule effect, the actuation beams produce heat flows P1 and P2 respectively. The flows at the movable part are perfectly compensated for each other if Rth1$a$=Rth2$a$ and Rth1$b$=Rth2$b$ for identical power levels.

The variable components are thus cancelled. The structure is thereby heated at a constant temperature.

The currents can be in the form:
$I_1 = i_0 + i_m(t)$ for the beam 1006.1,
$I_2 = i_0 - i_m(t)$ for the beam 1006.2.
Thereby, there is $\Delta T = 2i_0 i_m$ and $T_0 \propto i_0^2 + i_m^2 \sim i_0^2$ if $i_0 \gg i_m$. For a given heating $\Delta T$, $i_0$ can indeed be increased and $$i_m \propto \frac{1}{i_0}$$

can be taken to reduce the non-compensated component. Ideally, the currents are in the form, with $i_0 > i_m(t)$:

$$I_1 = i_0 \sqrt{1 + \frac{i_m(t)}{i_0}}$$

for the beam 1006.1, $$I_2 = i_0 \sqrt{1 - \frac{i_m(t)}{i_0}}$$

for the beam 1006.2.
In case of harmonic excitation, it is advantageous to take:
$I_1 = i_a \sin \omega t$ for the beam 1006.1,
$I_2 = i_a \cos \omega t$ for the beam 1006.2.
Which produce the heatings:
for the beam 1006.1:

$$T_1 \propto \frac{1 + \cos 2\omega t}{2},$$

for the beam 1006.2:

$$T_2 \propto \frac{1 - \cos 2\omega t}{2}.$$

Thereby, there is $\Delta T \propto \cos 2\omega t$ and $T_0$ is a constant.

The heat flow injected in the structure only preserves its static component, it is thus constant: indeed, the flow is proportional to the sum $I_1(t)^2 + I_2(t)^2 = i_a^2$ which is constant.

The structure and in particular the movable part 1004 do not undergo a temperature modulation. It is heated at a given temperature which can be taken into account in dimensioning the structure or actuating the same and/or processing signals it transmits to compensate for this constant temperature rise.

As a variant, the amplitude of either of the currents passing through the actuation beams could be modified to cancel or at least reduce the dynamic component of the resulting heat flow applied to the structure.

This compensation of heat flow can be very advantageous when the structure comprises means for detecting the movement of the movable part for example in the case of a sensor, and more generally when the structure comprises temperature-sensitive transduction members.

Figure 15:
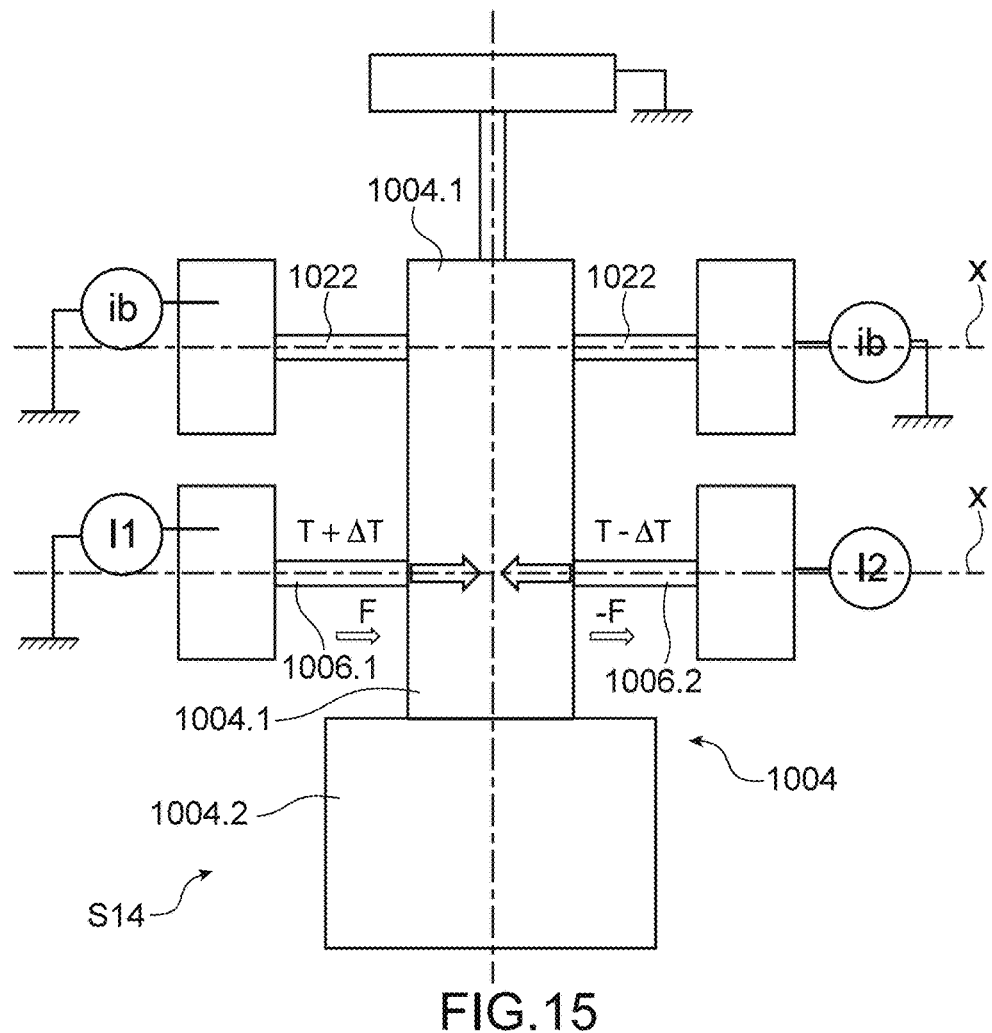
FIG. 15 is a top view of an alternative of the structure of FIG. 13 comprising means for detecting the movement of the movable part.

In FIG. 15, a structure S14 very close to the structure S12 can be seen, further comprising piezoresistive transduction means 1022 or piezoresistive gauges. These gauges are sensitive to temperature variations. In the example represented, the gauges are suspended between the fixed part 1002 and the narrow part 1004.1 of the movable part 1004 in parallel to the actuation beams and on either side of the movable part, allowing for example a differential measurement.

The currents I1 and I2 pass through the actuation beams 1006.1, 1006.2. When the heat flows generated by the actuation beams 1006.1, 1006.2 are compensated for at the movable part as has been described in connection with FIGS. 13 and 14, there is no temperature modulation which is transmitted to the gauges by the movable part, the temperature modulation which is synchronous with the motion of the movable part being thereby strongly reduced, which results in strongly reducing the heat signal, also called measurement base, at the piezoresistive gauges. Heating at a constant temperature of the gauges is taken into account in processing the signals they generate.

The bias current ib of the gauges can be either static, or modulated at a frequency $\omega_b$ different from the mechanical vibration frequency in order not to generate a base component which is superimposed with the mechanical signal, since a Joule effect also appears within the gauges. On the other hand, a thermal component can be generated at $\omega_b$ and its harmonics onto the structure. The bias current of the gauges can however be chosen low enough to limit undesirable effects on the structure.

Very advantageously, the actuation beams can also be used to measure motions of the movable part by making use of piezoresistivity properties of the material of the beam. The actuation and detection functions can thus be provided by the same beam. This enables the number of external connection pads to be reduced, which pads impose severe requirements on the component sizes, indeed 50×50 μm pads can be necessary to ensure a wire connection. The bulk of the structure is further reduced and its manufacture is simplified.

In all the examples represented, the pads can be voltage biased or current controlled in order to adapt the current levels which pass through the actuation beams.

Figure 16:
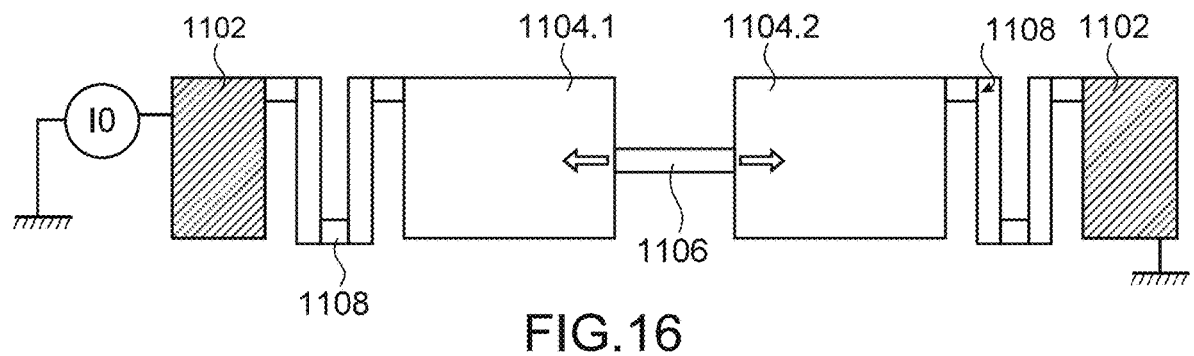
FIG. 16 is a schematic representation of a structure viewed from above with one actuation beam connecting two movable parts.

In all the exemplary embodiments, the structures can comprise several movable parts moved by one or more actuation beams activated by one or more current or voltage sources. In FIG. 16, an exemplary structure in which an actuation beam 1106 is directly connected to two movable parts 1104.1, 1104.2 and not directly to a fixed part and to a movable part can be seen, the movable parts 1104.1, 1104.2 being suspended to the fixed part 1102, by suspending means 1108 enabling the current to be conducted up to the actuation beam. Several actuation beams could be provided. This structure makes it possible to favour vibration modes of the movable parts in opposite phase.

By virtue of the very low bulk of the structure according to the invention and of its high energy efficiency, the invention is particularly adapted to the integration in portable devices and in sensors that are attempted to be miniaturised.

The actuation beam(s) can be used to make self-testing, for example for microphones, accelerometers, etc. A microphone or accelerometer does not require any actuation means for its operation. However, such actuation means can be provided to make sure of the integrity of the mechanical response of the movable structure. By using the detection gauges as an actuation means, it is possible to fulfil this issue without adding connection pads to actuation electrodes and thus to reduce the requirements on the component dimensions. Because of the low bulk of the electrothermally actuated beams, their integration is not or little a problem.

The actuation beams can be used to compensate for significant strains produced by accelerations for example. The automatic control by capacitive actuation means can in some cases demand very high voltage levels hardly available for autonomous or mobile platforms. By virtue of the present invention, because of the high intensity of the electrothermal force which can be obtained, such an automatic control can be contemplated.

The MEMS and/or NEMS structure is made by microelectronic and/or nanoelectronic techniques well known to those skilled in the art.

The invention can enable gyrometers to be made, the beams being used to excite the movable part(s) of the gyrometer and possibly their movement to be detected.

The invention can be used in the fields of resonant sensors and actuators, for example to make oscillators for time bases, biochemical mass detection, etc. and in the field of the systems using actuators requiring the generation of significant forces in order to position or move a mechanical element, such as a switch, a mirror, or for compensating for external strains via a feedback loop, for example in slaved accelerometers, gyrometers.

The invention claimed is:

1. An electrothermally actuated device comprising:
   at least one of a microelectromechanical structure and a nanoelectromechanical structure, said at least one of the microelectromechanical structure and the nanoelectromechanical structure comprising
   a fixed part,
   at least one movable part configured to move with respect to the fixed part,
   at least one set of several electrothermal actuation beams configured to flow an electric current from the fixed part to the movable part, to mechanically connect to the movable part, and configured to simultaneously apply an electrothermal force having a same direction on the movable part, and
   at least one electrically conducting connecting element configured to electrically connect the movable part to the fixed part,
   wherein the set of several electrothermal actuation beams has a cross-sectional thickness lower than or equal to half a thickness of the movable part and lower than or equal to half a thickness of the at least one electrically conducting connecting element, and the electrothermal actuation beams are nanowires.

2. The electrothermally actuated device according to claim 1, wherein the thickness and/or width of the actuation beams is lower than or equal to 500 nm.

3. The electrothermally actuated device according to claim 1, wherein the electrothermal actuation beams comprise one or more thermoelastic materials configured to be deformed under an effect of a Joule-effect induced heating by the electric current for flowing in said beams.

4. The electrothermally actuated device according to claim 1, wherein a ratio of the width and the thickness of each of the electrothermal actuation beams is between 1 and 2.

5. The electrothermally actuated device according to claim 1, wherein the at least one electrically conducting connecting element has a shape such that an electrothermal force generated in the at least one electrically conducting connection element does not substantially oppose the electrothermal force generated in the actuation beams.

6. The electrothermally actuated device according to claim 5, wherein the at least one electrically conducting connecting element is in the shape of a spring folded as slots.

7. The electrothermally actuated device according to claim 5, wherein the at least one electrically conducting connecting element extends along an axis perpendicular to an axis to which the actuation beams are parallel.

8. The electrothermally actuated device according to claim 5, comprising two connecting elements aligned along an axis perpendicular to an axis to which the actuation beams are parallel.

9. The electrothermally actuated device according to claim 1, comprising a rotational hinge between the fixed part and the movable part and wherein the actuation beams are disposed with respect to the movable part to cause rotation of the movable part with respect to the fixed part, said rotation being in- or out-of-plane of the structure, the actuation beams being in a plane of the movable part at least in a resting state.

10. The electrothermally actuated device according to claim 7, comprising a rotational hinge between the fixed part and the movable part and wherein the actuation beams are disposed with respect to the movable part to cause rotation of the movable part with respect to the fixed part, said rotation being in- or out-of-plane of the structure, and wherein the rotational hinge comprises the at least one electrically conducting connecting element defining the axis of rotation, said at least one electrically conducting connecting element being torsionally deformable and wherein the actuation beams are mechanically connected to the movable part such that the electrothermal forces generated in the actuation beams cause the out-of-plane rotation of the movable part, the actuation beams being in a plane of the movable part at least in a resting state.

11. The electrothermally actuated device according to claim 8, comprising a rotational hinge between the fixed part and the movable part and wherein the actuation beams are disposed with respect to the movable part so as to cause rotation of the movable part with respect to the fixed part, said rotation being in- or out-of-plane of the structure, and wherein the rotational hinge comprises the at least one electrically conducting connecting element defining the axis of rotation, said at least one electrically conducting connecting element being torsionally deformable and wherein the actuation beams are mechanically connected to the movable part such that the electrothermal forces generated in the actuation beams cause the out-of-plane rotation of the movable part, the actuation beams being in a plane of the movable part at least in a resting state.

12. The electrothermally actuated device according to claim 9, wherein the rotational hinge comprises two connecting elements the axes of which are secant.

13. The structure according to claim 1, wherein the movable part is mechanically connected to the fixed part by an anchor, said anchor forming a connecting element and wherein the actuation beams are oriented with respect to the movable part to cause elastic deformation of the movable part.

14. The electrothermally actuated device according to claim 1, wherein the thickness of the movable part and the thickness of the connecting element are equal.

15. The electrothermally actuated device according to claim 1, further comprising a detector configured to detect a movement of the movable part.

16. The electrothermally actuated device according to claim 15, wherein the detector is a piezoresistive detector.

17. The electrothermally actuated device according to claim 14, wherein the detector is formed by one or more actuation beams.

18. An actuator comprising at least one electrothermally actuated device comprising:
- at least one of a microelectromechanical structure and a nanoelectromechanical structure, said at least one of the microelectromechanical structure and the nanoelectromechanical structure comprising
- a fixed part,
- at least one movable part configured to move with respect to the fixed part,
- at least one set of several electrothermal actuation beams configured to flow an electric current from the fixed part to the movable part and configured to mechanically connect to the movable part and to simultaneously apply an electrothermal force having a same direction on the movable part, and
- at least one electrically conducting connecting element electrically configured to connect the movable part to the fixed part,
- wherein the set of several electrothermal actuation beams has a cross-sectional thickness lower than or equal to half a thickness of the movable part and lower than or equal to half a thickness of the at least one electrically conducting connecting element and the electrothermal actuation beams are nanowires.

19. A sensor comprising:
- at least electrothermally actuated device comprising at least one of a microelectromechanical structure and a nanoelectromechanical structure, said at least one of the microelectromechanical structure and the nanoelectromechanical structure comprising
- a fixed part,
- at least one movable part configured to move with respect to the fixed part,
- at least one set of several electrothermal actuation beams configured to flow an electric current from the fixed part to the movable part, to mechanically connected to the movable part, and to simultaneously apply an electrothermal force having a same direction on the movable part, and
- at least one electrically conducting connecting element electrically configured to connect the movable part to the fixed part,
- wherein the set of several electrothermal actuation beams has a cross-sectional thickness lower than or equal to half a thickness of the movable part and lower than or equal to half a thickness of the at least one electrically conducting connecting element and the electrothermal actuation beams are nanowires.

* * * * *